US009337138B1

(12) United States Patent
Abugharbieh et al.

(10) Patent No.: US 9,337,138 B1
(45) Date of Patent: May 10, 2016

(54) CAPACITORS WITHIN AN INTERPOSER COUPLED TO SUPPLY AND GROUND PLANES OF A SUBSTRATE

(75) Inventors: Khaldoon S. Abugharbieh, Happy Valley, OR (US); Gregory Meredith, San Francisco, CA (US); Christopher P. Wyland, Livermore, CA (US); Paul Y. Wu, Saratoga, CA (US); Henley Liu, San Jose, CA (US); Sanjiv Stokes, Los Altos, CA (US); Yong Wang, Saratoga, CA (US)

(73) Assignee: XILINX, INC., San Jose, CA (US)

( * ) Notice: Subject to any disclaimer, the term of this patent is extended or adjusted under 35 U.S.C. 154(b) by 320 days.

(21) Appl. No.: 13/416,640

(22) Filed: Mar. 9, 2012

(51) Int. Cl.
*H01L 23/52* (2006.01)
*H01L 23/522* (2006.01)
*H01L 23/66* (2006.01)
*H01L 49/02* (2006.01)
*H01L 23/498* (2006.01)

(52) U.S. Cl.
CPC ........ *H01L 23/5222* (2013.01); *H01L 23/5223* (2013.01); *H01L 23/66* (2013.01); *H01L 28/40* (2013.01); *H01L 23/49822* (2013.01)

(58) Field of Classification Search
CPC . H01L 23/50; H01L 23/49822; H01L 23/642; H01L 23/66; H01L 23/49833; H01L 28/40; H01L 2924/30105; H01L 2924/19041; H01L 2924/16265
USPC .................. 257/691, 532, E23.144, E23.079, 257/E23.153; 438/599
See application file for complete search history.

(56) References Cited

U.S. PATENT DOCUMENTS

| 5,349,743 | A | 9/1994 | Grader et al. |
| 5,880,925 | A | 3/1999 | DuPre et al. |
| 6,031,445 | A | 2/2000 | Marty et al. |
| 6,291,872 | B1 | 9/2001 | Wang et al. |
| 6,342,681 | B1 | 1/2002 | Golderberger et al. |
| 6,407,907 | B1 | 6/2002 | Ahiko et al. |
| 6,459,561 | B1 | 10/2002 | Galvagni et al. |
| 6,477,032 | B2 | 11/2002 | Makl, Jr. |

(Continued)

FOREIGN PATENT DOCUMENTS

CN 101 866 908 10/2010

OTHER PUBLICATIONS

U.S. Appl. No. 13/075,059, filed Mar. 29, 2011, Jenkins et al.

(Continued)

*Primary Examiner* — Mark Tornow
*Assistant Examiner* — Abbigale Boyle
(74) *Attorney, Agent, or Firm* — W. Eric Webostad; Keith Taboada; Robert M. Brush

(57) ABSTRACT

An embodiment of an apparatus to reduce supply voltage noise with capacitors of an interposer of a stacked die is disclosed. In this embodiment, an interposer is coupled to a first integrated circuit die using a first plurality of interconnects. A substrate is coupled to the interposer using a second plurality of interconnects. The substrate includes a supply voltage plane and a ground plane, each of which is coupled to the first integrated circuit die using the second plurality of interconnects, the interposer, and the first plurality of interconnects. The interposer includes capacitors coupled in parallel using the supply voltage plane, the ground plane, and the second plurality of interconnects, where capacitance from capacitors of the interposer is provided to the first integrated circuit die using the supply voltage plane and the ground plane of the substrate.

16 Claims, 7 Drawing Sheets

(56) References Cited

U.S. PATENT DOCUMENTS

| | | | |
|---|---|---|---|
| 6,477,034 | B1 | 11/2002 | Chakravorty et al. |
| 6,534,249 | B2 | 3/2003 | Fork et al. |
| 6,548,338 | B2 | 4/2003 | Bernstein et al. |
| 6,606,237 | B1 | 8/2003 | Naito et al. |
| 6,611,188 | B2 | 8/2003 | Yeo et al. |
| 6,614,093 | B2 | 9/2003 | Ott et al. |
| 6,664,881 | B1 | 12/2003 | Thompson et al. |
| 6,759,727 | B2 | 7/2004 | Ju |
| 6,791,133 | B2 | 9/2004 | Farooq et al. |
| 6,794,904 | B2 | 9/2004 | Ooishi et al. |
| 6,828,666 | B1 | 12/2004 | Herrell et al. |
| 6,891,258 | B1 | 5/2005 | Alexander et al. |
| 6,961,231 | B1 | 11/2005 | Alexander et al. |
| 6,975,199 | B2 | 12/2005 | Long et al. |
| 7,071,807 | B1 | 7/2006 | Herbert |
| 7,109,838 | B2 | 9/2006 | Brennan et al. |
| 7,250,826 | B2 | 7/2007 | Gabara |
| 7,429,899 | B2 | 9/2008 | Gabara |
| 7,446,389 | B2 * | 11/2008 | Cornelius ......... H01L 23/49822 257/528 |
| 7,501,903 | B2 | 3/2009 | Gabara |
| 7,508,280 | B2 | 3/2009 | Gabara |
| 7,511,588 | B2 | 3/2009 | Gabara |
| 7,518,881 | B2 * | 4/2009 | Cornelius ..................... 361/760 |
| 7,701,319 | B2 | 4/2010 | Kitamura et al. |
| 7,786,836 | B2 | 8/2010 | Gabara |
| 8,068,004 | B1 | 11/2011 | Chong et al. |
| 8,125,059 | B2 | 2/2012 | Ito et al. |
| 2002/0085334 | A1 * | 7/2002 | Figueroa et al. ........... 361/301.4 |
| 2002/0101702 | A1 | 8/2002 | Maki, Jr. |
| 2003/0001287 | A1 | 1/2003 | Sathe |
| 2003/0062602 | A1 | 4/2003 | Frutschy et al. |
| 2005/0212127 | A1 | 9/2005 | Savastiouk et al. |
| 2006/0128059 | A1 | 6/2006 | Ahn et al. |
| 2006/0138591 | A1 * | 6/2006 | Amey et al. ................... 257/532 |
| 2006/0170527 | A1 | 8/2006 | Braunisch |
| 2006/0284718 | A1 | 12/2006 | Baumgartner et al. |
| 2007/0247268 | A1 | 10/2007 | Oya et al. |
| 2007/0268105 | A1 | 11/2007 | Walls |
| 2008/0084265 | A1 | 4/2008 | Kitamura et al. |
| 2008/0129394 | A1 | 6/2008 | Kissing et al. |
| 2008/0296697 | A1 * | 12/2008 | Hsu et al. ...................... 257/379 |
| 2008/0297299 | A1 | 12/2008 | Yun et al. |
| 2008/0309442 | A1 | 12/2008 | Hebert |
| 2008/0315356 | A1 | 12/2008 | Reisner |
| 2009/0039916 | A1 | 2/2009 | Buchmann et al. |
| 2009/0115050 | A1 | 5/2009 | Kasuya et al. |
| 2009/0180236 | A1 * | 7/2009 | Lee et al. .................... 361/301.4 |
| 2009/0189725 | A1 | 7/2009 | Ding et al. |
| 2010/0026368 | A1 | 2/2010 | Tang et al. |
| 2010/0067154 | A1 | 3/2010 | Deng et al. |
| 2010/0127937 | A1 | 5/2010 | Chandrasekaran et al. |
| 2010/0327424 | A1 | 12/2010 | Braunisch et al. |
| 2011/0084765 | A1 | 4/2011 | Kim et al. |
| 2011/0095395 | A1 | 4/2011 | Ellul et al. |
| 2011/0169171 | A1 | 7/2011 | Marcoux |
| 2011/0215472 | A1 | 9/2011 | Chandrasekaran |
| 2011/0259411 | A1 | 10/2011 | Liu |
| 2011/0291288 | A1 | 12/2011 | Wu et al. |
| 2012/0146209 | A1 | 6/2012 | Hu et al. |
| 2012/0147578 | A1 | 6/2012 | Jin et al. |

OTHER PUBLICATIONS

U.S. Appl. No. 13/187,234, filed Jul. 20, 2011, Kireev, Vassili et al.
U.S. Appl. No. 13/275,883, filed Oct. 18, 2011, Chong et al.
U.S. Appl. No. 13/329,832, filed Dec. 19, 2011, Rahman et al.
"ALLVIA to Present Latest Data for Silicon Interposers and Embedded Capacitors at IMAPS 2011," Marketwire.com, Sep. 28, 2011, downloaded Jan. 17, 2012 <http://www.marketwire.com/printer_friendly?id=1566307>.
"Xilinx Uses TSV+MLM interposers for 28nm FPGA—BetaBlog," Betasights.com, Nov. 8, 2010, 4 pp., downloaded Jan. 17, 2012. <betasights.net/wordpress/?p=1189>.
Braunisch, Henning et al., "High-Speed Performance of Silicon Bridge Die-to-Die Interconnects," *IEEE International Conference on Electrical Performance of Electronic Packages and Systems (EPEPS—2011)*, Oct. 23, 2011, pp. 95-98, EPEPS Administration, Urbana, Illinois, USA, http://epeps.ece.illinois.edu/.
Carlson, J. et al., "A Stackable Silicon Interposer with Integrated Through-Wafer Inductors," *Proc. of the 57th Electronic Components and Technology Conference*, May 29, 2007, pp. 1235-1238, IEEE, Piscataway, New Jersey, USA.
Galal, Sherif et al., "Broadband ESD Protection Circuits in CMOS Technology" *IEEE Journal of Solid-State Circuits*, Dec. 2003, pp. 2334-2340, vol. 38, No. 12, IEEE, Piscataway, New Jersey, USA.
Kossel, Marcel et al., "A T-Coil-Enhanced 8.5 Gb/s High-Swing SST Transmitter in 65 nm Bulk CMOS With < - 16 dB Return Loss Over 10 GHz Bandwidth", *IEEE Journal of Solid-State Circuits*, Dec. 2008, pp. 2905-2920, vol. 43, No. 12, IEEE, Piscataway, New Jersey, USA.
Lee, Heeseok et al., "Power Delivery Network Design for 3D SIP Integrated over Silicon Interposer Platform," *Proc. of the 57th Electronic Components and Technology Conference*, May 29, 2007, pp. 1193-1198, IEEE, Piscataway, New Jersey, USA.
Mori, Toshiaki et al., "Development of a New Interposer Including Embedded Thin Film Passive Elements," *IEEE Transactions on Advanced Packaging*, May 2009, pp. 503-508, vol. 32, No. 2, IEEE, Piscataway, New Jersey, USA.
Pillai, Edward et al., "Novel T-Coil Structure and Implementation in a 6.4-Gb/s CMOS Receiver to Meet Return Loss Specifications", *Proc. of the 57th Electronic Components and Technology Conference*, May 29, 2007, pp. 147-153, IEEE, Piscataway, New Jersey, USA.
Telli, Ali, "Practical performance of planar spiral inductors," *Proceedings of the 2004 11th IEEE International Conference on Electronics, Circuits and Systems*, Dec. 13, 2004, pp. 487-490, IEEE, Piscataway, New Jersey, USA.
Vishay Intertechnology, *An Introduction to Substrate PIMIC (Passive Integrated Microelectronic Interconnect Circuitry) Technology*, Tech Note 61082, Mar. 27, 2007, pp. 1-13, Vishay Intertechnology, Malvern, Pennsylvania, USA.
Yoon, Jun-Bo et al., "Surface Micromachined Solenoid On-Si and On-Glass Inductors for RF Applications," IEEE Electron Device Letters, Sep. 1999, pp. 487-489, vol. 20, No. 9, IEEE, Piscataway, New Jersey, USA.
Yue, C. Patrick, "On-Chip Spiral Inductors with Patterned Ground Shields for Si-Based RF IC's," IEEE Journal of Solid-State Circuits, May 1998, pp. 743-752, vol. 33, No. 5, IEEE, Piscataway, New Jersey, USA.
Galal S. et al., "Broadband ESD protection circuits in CMOS technology", IEEE Journal of Solid-State Circuits, IEEE Service Center, vol. 38, No. 12, Dec. 1, 2003, pp. 2334-2340, Piscataway, NJ USA.
Selmi L., et al., "Small-signal MMIC Amplifiers with bridged T-Coil Matching Networks", IEEE Journal of Solid-State Circuits, IEEE Service Center, vol. 27, No. 7, Jul. 1, 1992, pp. 1093-1096 , Piscataway, NJ USA.

* cited by examiner

CAPACITORS WITHIN AN INTERPOSER COUPLED TO SUPPLY AND GROUND PLANES OF A SUBSTRATE

FIELD OF THE INVENTION

An embodiment relates to integrated circuit devices. More particularly, an embodiment relates to supply voltage noise reduction using capacitors within an interposer that are coupled to supply and ground planes of a substrate.

BACKGROUND

Integrated circuits ("ICs") operate at high-frequencies. Byproducts of such high-frequency operation may include various forms of noise, including without limitation high-frequency voltage ripple ("Vr") present in an on-die power supply voltage.

A stacked die assembly ("stacked die") may include one or more IC die coupled to an interposer, which interposer is coupled to a package substrate. Such stacked die may be coupled to a printed circuit board ("PCB"). Such package substrate and PCB may have parasitic inductance ("L"), which in combination with changes in on-die current ("di/dt"), may promote voltage ripple. A first order approximation of voltage ripple (i.e., Vr~L di/dt) may be used to understand that as frequency increases, namely as the term dt decreases, voltage ripple may increase. Such voltage ripple or ripple voltage may increase to unacceptable levels for some applications, which may adversely impact analog and/or digital circuits that are sensitive to voltage ripple on a power supply voltage or other supply voltage.

Accordingly, it would be desirable and useful to reduce supply voltage noise.

SUMMARY

One or more embodiments generally relate to supply voltage noise reduction with capacitors of an interposer of a stacked die.

An embodiment relates generally to an apparatus. In such an embodiment, an interposer is coupled to a first integrated circuit die using a first plurality of interconnects. A substrate is coupled to the interposer using a second plurality of interconnects. The substrate includes a supply voltage plane and a ground plane, each of which is coupled to the first integrated circuit die using the second plurality of interconnects, the interposer, and the first plurality of interconnects. The interposer includes a plurality of capacitors coupled in parallel using the supply voltage plane, the ground plane, and the second plurality of interconnects, where the plurality of capacitors of the interposer provide capacitance to the first integrated circuit die using the supply voltage plane and the ground plane of the substrate.

An embodiment relates generally to a method. In such an embodiment, provided is an interposer coupled to an integrated circuit die using a first plurality of interconnects and coupled to a substrate using a second plurality of interconnects. The substrate includes a supply voltage plane and a ground plane coupled to the integrated circuit die using the second plurality of interconnects, the interposer, and the first plurality of interconnects. The interposer includes a plurality of capacitors coupled in parallel using the supply voltage plane, the ground plane, and the second plurality of interconnects. Capacitance is delivered from the plurality of capacitors of the interposer to the integrated circuit die using the supply voltage plane and the ground plane of the substrate.

An embodiment relates generally to another apparatus. In such an embodiment, an integrated circuit die includes a first capacitor for providing a first capacitance. An interposer is coupled to the integrated circuit die using a first plurality of interconnects. A substrate is coupled to the interposer using a second plurality of interconnects. The substrate includes a supply voltage plane and a ground plane coupled to the integrated circuit die using the second plurality of interconnects, the interposer, and the first plurality of interconnects. The interposer includes a plurality of capacitors coupled in parallel using the supply voltage plane, the ground plane, and the second plurality of interconnects. The substrate includes a second capacitor coupled to the supply voltage plane and the ground plane for providing a second capacitance to the integrated circuit die through the interposer. A third capacitance from the plurality of capacitors of the interposer is provided to the integrated circuit die using the supply voltage plane and the ground plane of the substrate.

BRIEF DESCRIPTION OF THE DRAWINGS

Accompanying drawings show exemplary embodiments. However, the accompanying drawings should not be taken to limit the embodiments shown, but are for explanation and understanding only.

DETAILED DESCRIPTION

Figure 1:
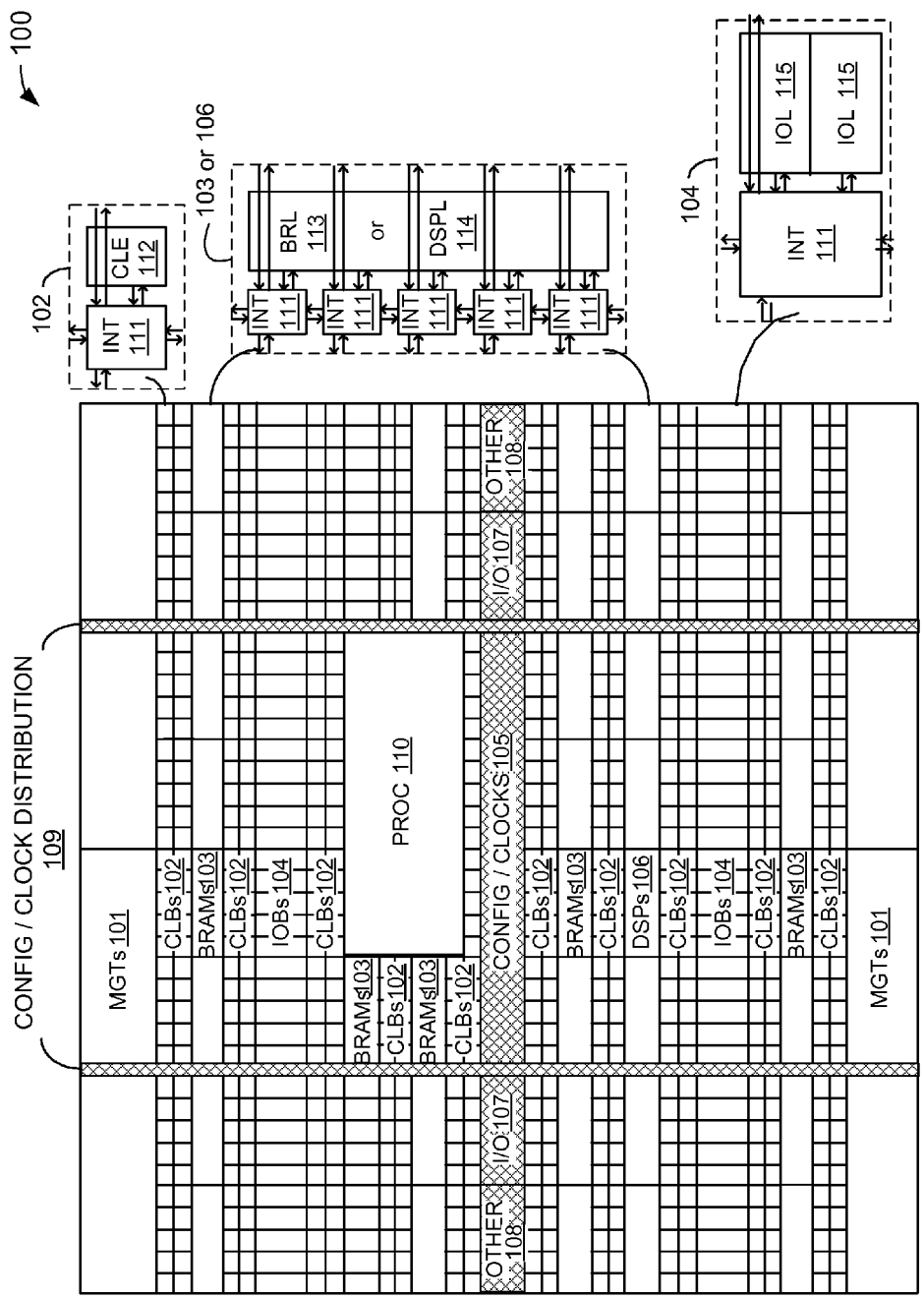
FIG. 1 is a simplified block diagram depicting an exemplary embodiment of a columnar Field Programmable Gate Array ("FPGA") architecture.

In the following description, numerous specific details are set forth to provide a more thorough description of the specific embodiments. It should be apparent, however, to one skilled in the art, that one or more embodiments may be practiced without all the specific details given below. In other instances, well known features have not been described in detail so as not to obscure the one or more embodiments. For ease of illustration, the same number labels are used in different diagrams to refer to the same items; however, in alternative embodiments the items may be different.

Before describing exemplary embodiments illustratively depicted in the several figures, a general introduction is provided to further understanding.

In high-speed ICs, a high-frequency voltage ripple ("noise") may be present on a die power supply voltage and/or other supply voltage. In order to reduce such noise, an on-IC die capacitance may be used to filter such noise. However, forming one or more embedded capacitors in an IC die to filter noise may consume a significant amount of semiconductor real estate, which may significantly add to the cost to manufacture such IC die. Another approach to reduce such noise is to add an embedded capacitor in a package substrate; however, such capacitance may be too far removed from the IC die to be sufficiently effective.

As described below in additional detail, an interposer includes capacitors that are located in an available region of such interposer. Accordingly, an interposer is closer to an IC die than a package substrate, and formation of capacitors on an available region of an interposer does not consume expensive semiconductor real estate of an IC die. Such interposer capacitors may be coupled to such IC die through supply voltage and ground planes of a package substrate to reduce noise in a supply voltage on such supply voltage plane. Optionally, such interposer capacitors may be coupled to supply voltage and ground buses of such interposer for coupling to such IC die, as well as respectively coupling to such supply voltage and ground planes, to deliver capacitance to such IC die.

With the above general understanding borne in mind, various embodiments for noise reduction are generally described below.

Because one or more of the above-described embodiments are exemplified using a particular type of IC, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 2A:
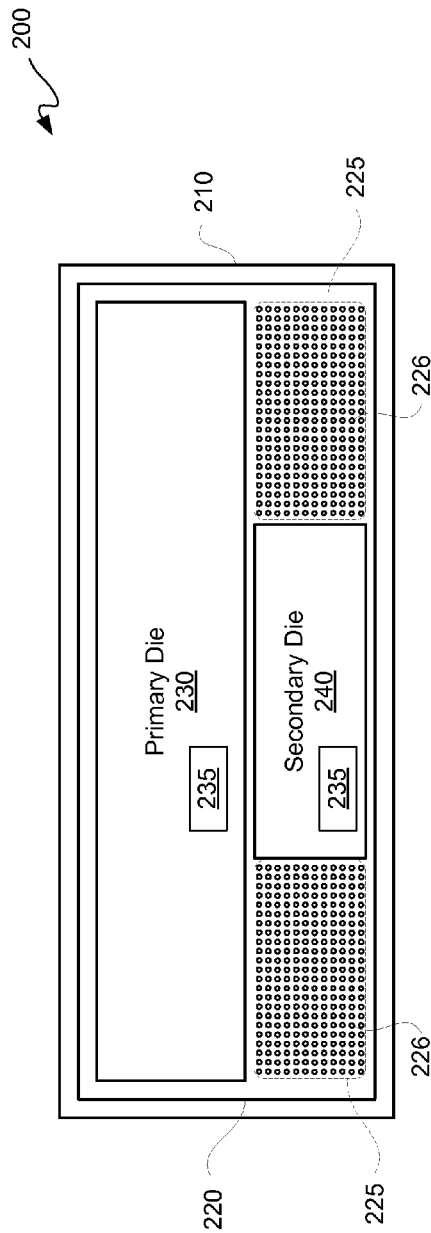
FIG. 2A is a block diagram of a top view depicting an exemplary embodiment of a stacked die.

FIG. 2A is a block diagram of a top view depicting an exemplary embodiment of a stacked die 200. Stacked die 200 may be for an FPGA, an SoC, a pseudo-SoC, and the like, among other types of ICs. Stacked die 200 may include a primary IC die ("primary die") 230, a secondary IC die ("secondary die") 240, an interposer die ("interposer") 220, and a substrate such as, e.g., package substrate 210. Primary die 230 and secondary die 240 may be coupled to interposer 220 using a plurality of interconnects ("interconnects") 226. Such interconnects 226 may be any die-to-die interconnects, including without limitation fine pitch micro pads or bumps ("micro bumps"). For purposes of clarity by way of example not limitation, it shall be assumed that such interconnects 226 are micro bumps 226.

Primary die 230 may be any IC die, and secondary die 240 may be the same or any other IC die as primary die 230. Primary die 230 may have a first layout area or aspect ratio, and secondary die 240 may have a second layout area or aspect ratio. Such second layout area may be substantially smaller than such first layout area leaving one or more open spaces 225 on interposer 220. For purposes of clarity by way of example not limitation, primary die 230 may be an FPGA slice, and secondary die 240 may be a memory die. An FPGA slice may be a substantially larger die than a memory die, and accordingly, an FPGA slice may occupy more interposer 220 surface area than a memory die. Such dissimilarity in die sizes may leave one or more open spaces 225 in a stacked die 200. Such one or more open spaces 225 may correspond to one or more regions in interposer 220 available for formation of a plurality of capacitors, as described below in additional detail. Optionally, either or both primary die 230 and secondary die 240 may include an embedded capacitor 235. Embedded capacitor 235 may be coupled between a supply voltage line or bus and a ground voltage ("ground") line or bus to provide a decoupling or noise filtering capacitance. Open spaces 225 may exist under any die, including without limitation primary die 230 and/or secondary die 240, and thus secondary die 240 may but does not need to be smaller than primary die 230 to leave open spaces 225.

Micro bumps 226 in open spaces 225 may be test and/or dummy interconnects. Such micro bumps 226 may be formed to provide more uniformity across a top surface of interposer 220 for subsequent coating and/or attaching of one or more die. Along those lines, even though a primary die 230 and a secondary die 240 are illustratively depicted, in other embodiments of stacked die 200, interposer 220 may have a single IC die or more than two IC dies attached to it.

Figure 2B:
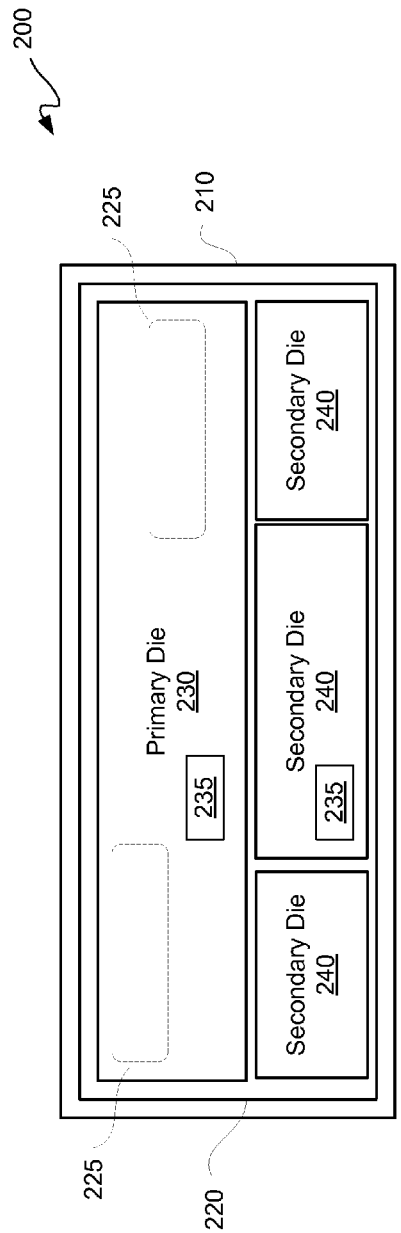
FIG. 2B is a block diagram of a top view depicting another exemplary embodiment of a stacked die.

FIG. 2B is a block diagram of a top view depicting another exemplary embodiment of a stacked die 200. In this exemplary embodiment of stacked die 200, two additional secondary die 240 are coupled to interposer 220 in what were open spaces 225. However, primary die 230 in this exemplary embodiment has at least one region where capacitors may be formed below in interposer 220, which effectively provides at least one available region for formation of a plurality of capacitors in interposer 220. For example, such regions in primary die 230 may be occupied by one or more blocks of a logic not having pinouts directly connected to them, and thus area below such one or more blocks of logic on interposer 220 may effectively be available for formation of a plurality of capacitors in interposer 220.

For purposes of clarity by way of example not limitation, stacked die 200 of FIG. 2A is described below in additional detail with respect to one or more embodiments of interposer 220. However, any of these embodiments of stacked die 200, as well as variations thereof, may be used in accordance with the following description.

Figure 3:
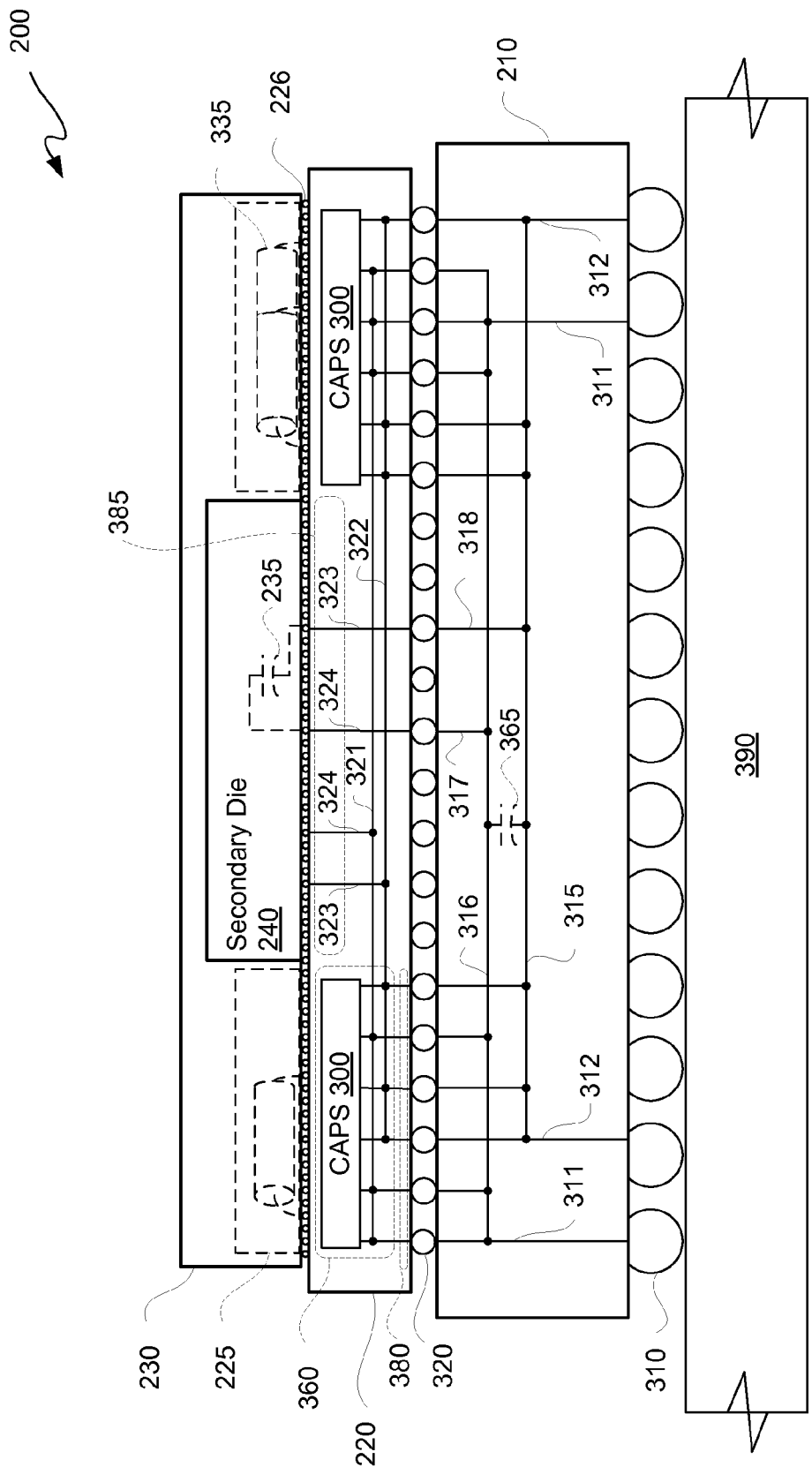
FIG. 3 is a block diagram of a cross-sectional view depicting an exemplary embodiment of the stacked die of FIG. 2A.

FIG. 3 is a block diagram of a cross-sectional view depicting an exemplary embodiment of stacked die 200 of FIG. 2A. Stacked die 200 is described below in further detail with simultaneous reference to FIGS. 2A and 3.

Primary die 230 and secondary die 240 are interconnected to interposer 220 with micro bumps 226. Optionally, either or both of open spaces 225 may be occupied by one or more discrete capacitors 335. Such one or more discrete capacitors 335 may be coupled in parallel with capacitors 300 of interposer 220 via micro bumps 226 to increase overall capacitance. For purposes of clarity and not limitation, it shall be assumed that optional discrete capacitors 335 are not used; however, from the following description it will be apparent that one or more optional discrete capacitors 335 may be coupled to capacitors 300.

Regions 360 in interposer 220 correspond to open spaces 225. In some embodiments, the area of secondary die 240 may be equal to or less than the area of primary die 230 where open spaces 225 exist for capacitors 300 of FIG. 3 underneath such primary die 230 and/or secondary die 240. Thus, capacitors 300 of FIG. 3 may be located in any available location in interposer 220.

Within regions 360, capacitors 300, as well as associated conductive vias and wires ("lines"), may be formed. Additionally, interposer 220 may include a supply voltage bus 321 and a ground bus 322 which extend into or at least proximate to regions 360 for interconnection with capacitors 300. One or more vias 324 may interconnect supply voltage bus 321 to micro bumps 226 for coupling to one or more supply voltage inputs of secondary die 240. One or more vias 323 may interconnect ground bus 322 to micro bumps 226 for coupling to one or more ground inputs of secondary die 240.

Optionally, secondary die 240 may include an embedded capacitor 235, and supply voltage bus 321 and ground bus 322 may be coupled to such optional embedded capacitor 235. More particularly, such optional embedded capacitor 235 may be coupled between supply voltage bus 321 and ground bus 322 to provide a noise filtering or decoupling capacitance. For purposes of clarity by way of example and not limitation, optional embedded capacitor 235 is illustratively depicted as being in secondary die 240; however, an optional embedded capacitor 235 may be in either or both primary die 230 and secondary die 240, and such one or more optional embedded capacitors 235 may be interconnected between supply voltage bus 321 and ground bus 322. Embedded capacitors 235 consume die space, and accordingly, one or more embedded capacitors 235 may optionally be omitted by use of capacitors 300 in interposer 220 to avoid consumption of semiconductor real estate of an IC die for reasons previously described herein. In short, capacitors 300 may be close enough to an IC die, such as primary die 230 and/or secondary die 240, to sufficiently reduce high-frequency voltage ripple in a supply voltage such that one or more embedded capacitors 235 may be omitted.

Capacitors 300 may be coupled to interconnects 320 with through-substrate vias 380 of interposer 220. In an embodiment, capacitors 300 may be coupled by routing to micro bumps 226 through one or more routing re-distribution layers ("RDLs"), which is generally indicated as region 385 ("RDLs 385"). Generally, RDLs 385 include the final one to three metal layers deposited in the formation of a die, including without limitation interposer 220. This last set of metal layer generally is thicker than earlier formed metal layers, excluding through-substrate vias 380 as described below, and thus generally may have less resistance.

Interconnects 320 may interconnect interposer 220 with package substrate 210. Interconnects 320 may be any die-to-package substrate interconnects, including without limitation Flip-Chip or Controlled Collapse Chip Connection ("C4") balls or bumps ("C4 bumps"). For purposes of clarity by way of example and not limitation, interconnects 320 are described below as C4 bumps 320. Additionally, for interposer 220 formed using a silicon substrate, through-substrate vias 380 may be Through-Silicon Vias ("TSVs"). However, substrates other than silicon substrates may be used for interposer 220. An interposer, such as interposer 220 for example, may start with a silicon substrate into which vias are formed for TSVs, followed by subsequent process operations.

Because dummy micro bumps 226 may be located above C4 bumps 320, there may be many previously unused C4 bumps 320 below such dummy micro bumps 226. Such C4 bumps 320 may therefore be used as described hereinbelow in additional detail.

Package substrate 210 may include a ground voltage ("ground") plane 315 and a supply voltage plane 316. Capacitors 300 may be coupled to ground plane 315 and supply voltage plane 316 through C4 bumps 320. Vias 311 of package substrate 210 may couple supply voltage plane 316 to interconnects 310. Interconnects 310 may couple package substrate 210 to printed circuit board ("PCB") 390. Interconnects 310 may be any package substrate-to-PCB interconnects, including without limitation ball grid array ("BGA") solder balls. For purposes of clarity by way of example not limitation, interconnects 310 are described below as solder balls 310.

Vias 311 may further couple C4 bumps 320 to solder balls 310. Vias 312 of package substrate 210 may couple ground plane 315 to solder balls 310, and may further couple C4 bumps 320 to solder balls 310. Vias 317 and 318 of package substrate 210 may couple supply voltage plane 316 and ground plane 315, respectively, to C4 bumps 320, and vias 324 and 323 of interposer 220 may respectively couple supply voltage plane 316 and ground plane 315 through such associated C4 bumps 320 and through associated micro bumps 226 to primary and/or secondary die 240. Package substrate 210 may optionally have an embedded capacitor 365 coupled between supply voltage plane 316 and ground plane 315.

In embodiments, high-frequency voltage ripple in a supply voltage of an IC die, such as primary die 230 and/or secondary die 240, is reduced by delivering capacitance from capacitors 300. In an embodiment, capacitors 300 and capacitor 365 are coupled, which coupling may be in parallel, to provide many effective capacitances in combination to reduce such high-frequency voltage ripple in a supply voltage of such IC die. In another embodiment, capacitors 300, capacitor 365, and capacitor 235 are coupled, which coupling may be in parallel, to provide the several effective capacitances in combination to reduce high-frequency voltage ripple in a supply voltage of such IC die. In yet another embodiment, capacitors 300, capacitor 365, capacitor 235, and one or more of capacitors 335 are coupled, which coupling may be in parallel, to provide the several effective capacitances in combination to reduce high-frequency voltage ripple in a supply voltage of such IC die.

Accordingly, supply voltage plane 316 and ground plane 315 of package substrate 210 are each coupled to primary die 230 and/or secondary die 240 through C4 bumps 320, interposer 220, and micro bumps 226, including vias 317, 318, 324, and 323. Even though vias 317, 318, 323, and 324 are illustratively depicted as being below a central area of secondary die 240 for purposes of clarity, in other embodiments I/Os of a die may be located below a peripheral area of an IC die. However, vias 317, 318, 323, and 324 may be offset away from such central area, such as along a perimeter of secondary die 240 for example. Because planes and/or busing are used for effectively reducing the number of vias 317, 318, 323, and 324 used to couple to an IC die, such as secondary die 240 for example, connection width used for coupling to such IC die is reduced. Generally, this reduction in width used to couple to an IC die facilitates interconnections being off to a side of such an IC die. In other words, less busing width is used, so a narrower window for connection may be used.

Capacitors 300 of interposer 220 are coupled in parallel using supply voltage plane 316, ground plane 315 (as described below in additional detail), and C4 bumps 320. Capacitance from capacitors 300 of interposer 220 is capable of being provided to primary die 230 and/or secondary die 240 using supply voltage plane 316 and ground plane 315 of package substrate 210, as described below in additional detail.

FIGS. 4A through 4D are block diagrams of cross-sectional views of supply voltage and ground pathways of stacked die 200 of FIG. 3. For purposes of clarity, supply voltage and ground pathways of stacked die 200 of FIG. 3 have effectively been highlighted with thick lines in order to more readily identify such pathways. With simultaneous reference to FIGS. 3, and 4A through 4D, one or more embodiments of stacked die 200 are further described.

Figure 4A:
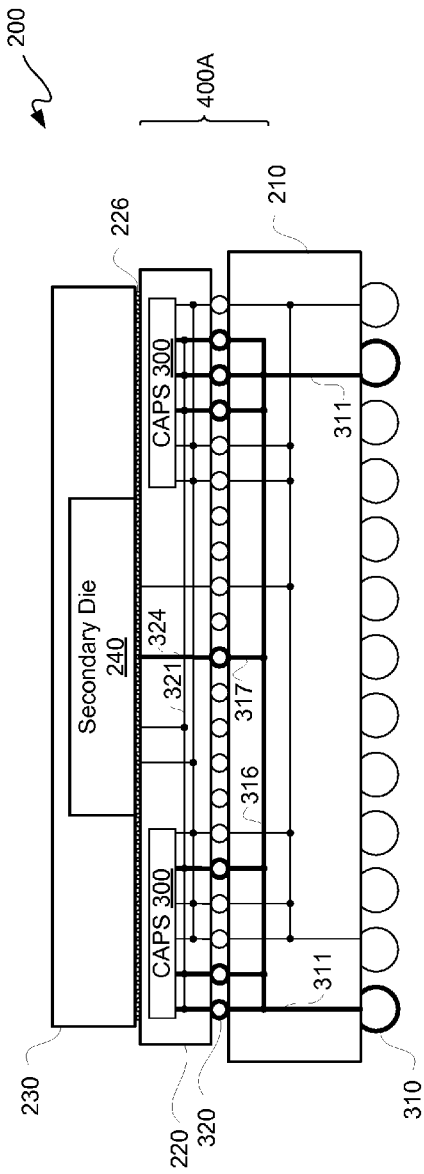
FIGS. 4A through 4D are block diagrams of cross-sectional views of supply voltage and ground pathways of the stacked die of FIG. 3.

With reference to FIG. 4A, tier 400A includes an interposer-package substrate-interposer-IC die supply voltage pathway. Solder balls of solder balls 310 for providing supply voltage are coupled to respective vias 311 for coupling to supply voltage plane 316, and vias 317 couple supply voltage plane 316 to C4 bumps of C4 bumps 320. Vias of interposer 220 may couple capacitors 300 to such C4 bumps of C4 bumps 320 for interconnection with supply voltage plane 316, and one or more vias 324 may couple one or more C4 bumps of C4 bumps 320 to one or more micro bumps 226. Optionally, such vias 324 of interposer 220 may couple supply voltage bus 321 to supply voltage plane 316. Vias 324 are coupled to primary die 230 and/or secondary die 240 through one or more micro bumps 226. Accordingly, one or more supply voltage pathways may have capacitors 300 coupled to primary die 230 and/or secondary die 240 going from interposer 220 to supply voltage plane 316 of package substrate 210 and back to and through interposer 220 to primary die 230 and/or secondary die 240.

Figure 4B:
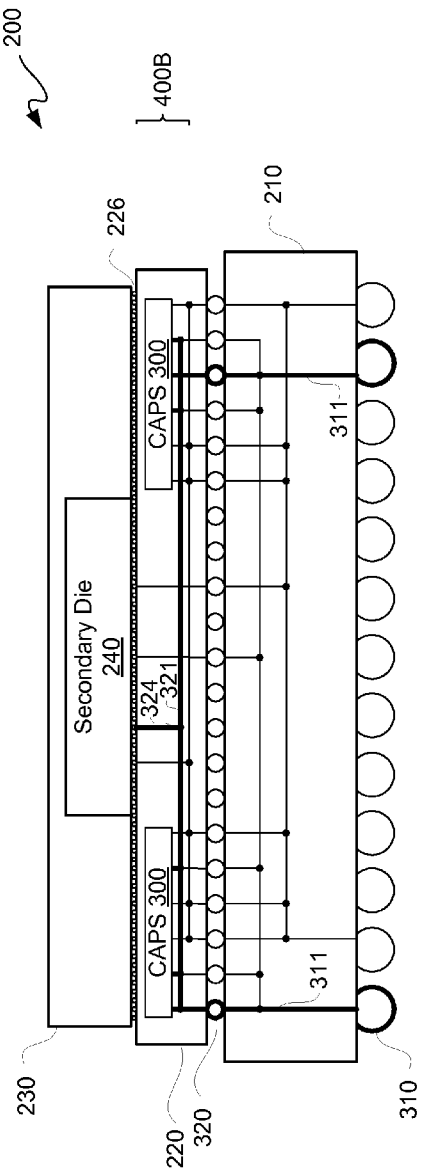

With reference to FIG. 4B, tier 400B includes an interposer-IC die supply voltage pathway. Solder balls of solder balls 310 for providing supply voltage are coupled to respective vias 311 for coupling to supply voltage plane 316 and to C4 bumps of C4 bumps 320. Such C4 bumps of C4 bumps 320 are coupled to capacitors 300 and supply voltage bus 321 through vias of interposer 220. Supply voltage bus 321 is coupled to primary die 230 and/or secondary die 240 through one or more vias 324 and one or more micro bumps 226. Accordingly, one or more supply voltage pathways may have capacitors 300 coupled to primary die 230 and/or secondary die 240 going from supply voltage bus 321 of interposer 220 to micro bumps 226 and then to primary die 230 and/or secondary die 240.

Generally, there are two separate supply voltage pathways coupled to capacitors 300, namely one of such supply voltage pathways goes from interposer 220 to package substrate 210 and then back through interposer 220 to an IC die, and another one of such supply voltage pathways goes from interposer 220 directly to an IC die. Likewise, generally, there are two separate ground voltage pathways coupled to capacitors 300, namely one of such ground voltage pathways goes from interposer 220 to package substrate 210 and then back through interposer 220 to an IC die, and another one of such ground voltage pathways goes from interposer 220 directly to an IC die, as described in additional detail with reference to FIGS. 4C and 4D.

Figure 4C:
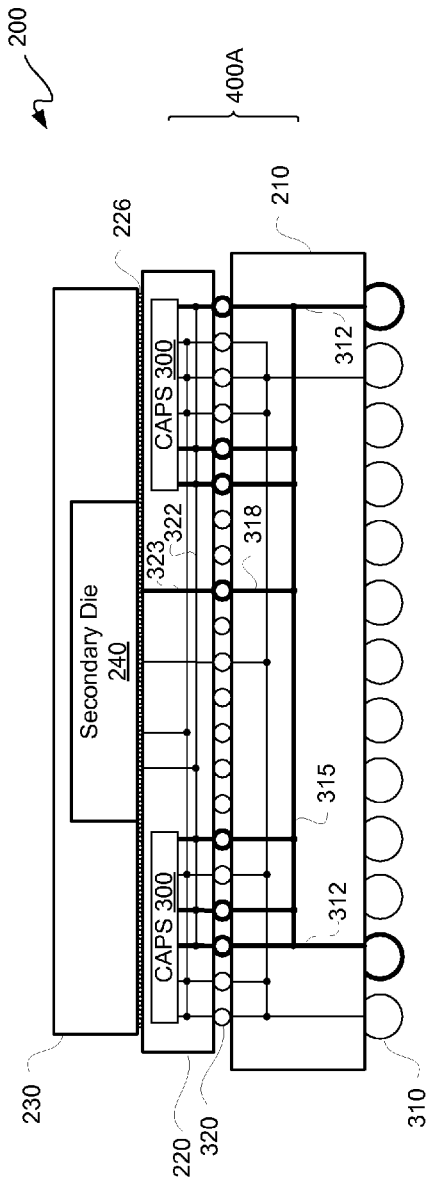

With reference to FIG. 4C, tier 400A includes an interposer-package substrate-interposer-IC die ground voltage pathway. Solder balls of solder balls 310 for providing ground voltage are coupled to respective vias 312 for coupling to ground plane 315, and vias 318 couple ground plane 315 to C4 bumps of C4 bumps 320. Vias of interposer 220 couple capacitors 300 to such C4 bumps of C4 bumps 320 for interconnection with ground plane 315, and one or more vias 323 couple one or more C4 bumps of C4 bumps 320 to one or more micro bumps 226. Optionally, such vias 323 of interposer 220 may couple ground bus 322 to ground plane 315. Vias 323 are coupled to primary die 230 and/or secondary die 240 through one or more micro bumps 226. One or more ground voltage pathways may have capacitors 300 coupled to primary die 230 and/or secondary die 240 going from interposer 220 to ground plane 315 of package substrate 210 and back to and through interposer 220 to primary die 230 and/or secondary die 240.

Figure 4D:
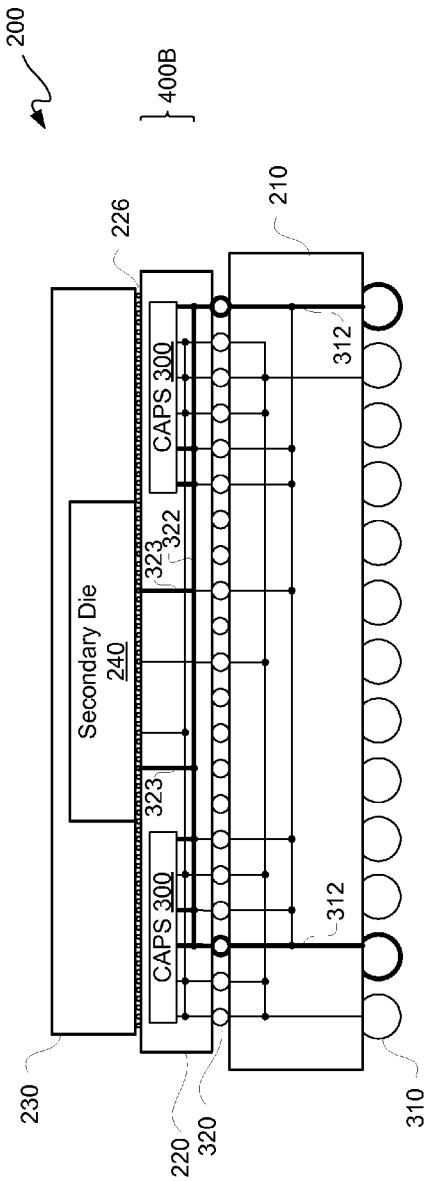

With reference to FIG. 4D, tier 400B includes an interposer-IC die ground voltage pathway. Solder balls of solder balls 310 for providing ground voltage are coupled to respective vias 312 for coupling to ground plane 315 and to C4 bumps of C4 bumps 320. Such C4 bumps of C4 bumps 320 are coupled to capacitors 300 and ground bus 322 through vias of interposer 220. Ground bus 322 is coupled to primary die 230 and/or secondary die 240 through one or more vias 323 and one or more micro bumps 226. One or more ground voltage pathways may have capacitors 300 coupled to primary die 230 and/or secondary die 240 going from ground bus 322 of interposer 220 to micro bumps 226 and then to primary die 230 and/or secondary die 240.

Accordingly, a two tiered supply and ground voltage pathway architecture is described. Each of such tiers 400A and 400B may be used together, but pathways of such tiers 400A and 400B may be independent of one another. This allows for multiple supply and voltage planes or buses to be used. Planes or buses may have associated parasitic inductance and resistance which may negatively impact providing a noise reducing capacitance. Such parasitic inductance and resistance may vary from interposer-to-interposer, from substrate package-to-substrate package, and/or from PCB-to-PCB. Moreover, the further a capacitor is from an IC die, the more likely that parasitic inductance and resistance may negatively impact noise reduction. In other words, the effective capacitance may be reduced due to the effective inductance and effective resistance, which may vary from implementation to implementation. However, having multiple tiers, such as tiers 400A and 400B, enhances the likelihood that at least a minimum effective capacitance for reducing noise, such as high-frequency voltage ripple, is provided. Along those lines, because planes or buses are coupled in parallel, parasitic inductance and resistance may be reduced. Additionally, an embedded capacitor in a package substrate may have associated parasitic inductance and resistance, which reduces its effective capacitance for noise reduction. However, by adding capacitance from embedded interposer capacitors 300, effective capacitance is enhanced.

Figure 5:
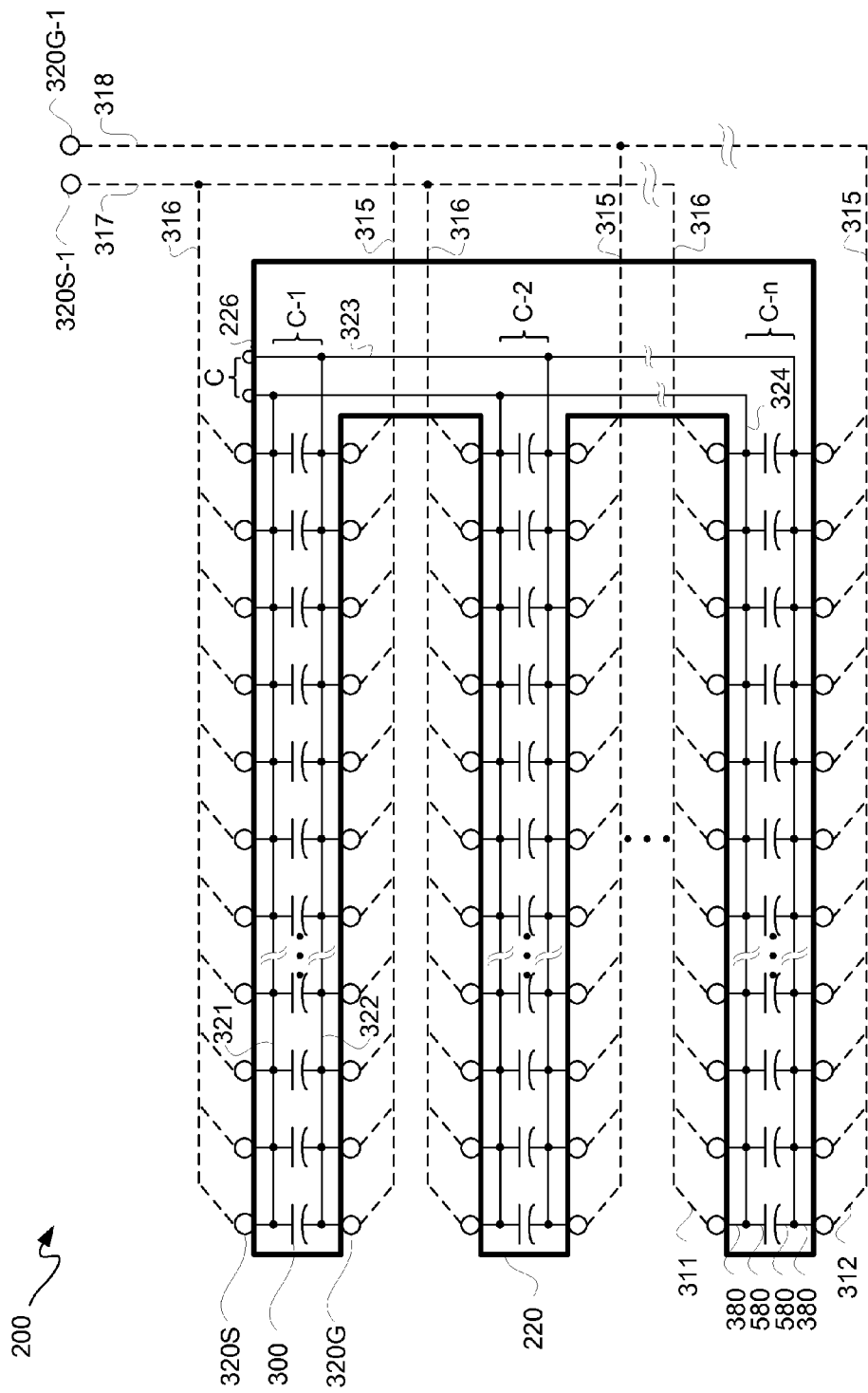
FIG. 5 is a block/schematic diagram depicting an exemplary embodiment of capacitors of an interposer of the stacked die of FIG. 3.

FIG. 5 is a block/schematic diagram depicting an exemplary embodiment of capacitors 300 of interposer 220 of stacked die 200 of FIG. 3. Capacitors 300 are coupled in parallel using supply voltage bus 321 and ground bus 322 of interposer 220. Supply voltage-side C4 bumps 320S are coupled to a supply voltage-side of capacitors 300 and to supply voltage bus 321 through vias 380 and 580. Likewise, ground-side C4 bumps 320G are coupled to a ground-side of capacitors 300 to ground bus 322 through vias 380 and 580.

For purposes of clarity, supply voltage plane 316 and ground plane 315 are shown with dashed lines so as to more readily distinguish them from conductive lines of interposer 220. Supply voltage plane 316 is coupled to supply voltage-side C4 bumps 320S through vias 311, and ground plane 315 is coupled to ground-side C4 bumps 320G through vias 312. Supply voltage plane 316 is coupled to a supply voltage-side C4 bump 320S-1 through via 317, and ground plane 315 is coupled to a ground-side C4 bump 320G-1 through via 318.

Supply voltage bus 321 is coupled in parallel with supply voltage plane 316 through interconnects 320S, and ground bus 322 is coupled in parallel with ground plane 315 through interconnects 320G. By coupling supply voltage plane 316 and supply voltage bus 321 in parallel, parasitic inductance and resistance associated with those conductors is reduced. Furthermore, by coupling ground plane 315 and ground bus 322 in parallel, parasitic inductance and resistance associated with those conductors is likewise reduced.

By coupling capacitors 300 in parallel, their individual capacitances are added. Even though three banks or sets of 10 capacitors 300 each is illustratively depicted, in other embodiments fewer or more banks and/or fewer or more capacitors 300 in each of such banks may be used. Each bank of capacitors 300 has an associated capacitance. A first bank of capacitors 300 has a capacitance C-1. A second bank of capacitors 300 has a capacitance C-2. A third bank, and in this exemplary embodiment a final bank, of capacitors 300 has a capacitance C-n, for n equal to three in this example. Each capacitance C-n is the sum total of capacitances of each individual capacitor in such bank. Each bank of capacitors may be coupled in parallel with one another, and thus capacitances of each bank are additive. In other words, a total capacitance C in this example is equal to the sum of capacitances C-1 through C-n. Such total capacitance C may be present at pairs of micro bumps 226 for providing to an IC die, as previously described.

Capacitors 300 may be formed in any of a variety of configurations including without limitation trench capacitors, parallel plate capacitors, container cell capacitors, finger capacitors, metal-insulator-metal ("MIM"), and the like. In an embodiment, MIM capacitors 300 are used. While metal capacitors may not have high capacitive density, a large area available within interposer 220 provides for a significant amount of capacitance using metal capacitors. However, in other embodiments, other types of conductive materials, such as doped polycrystalline silicon ("poly") and/or any other conductive material, as well as any dielectrics used in forming capacitors in such materials, may be used.

Even though individual vias and interconnects have been shown for each capacitor 300; however, because capacitors 300 are bused using supply voltage bus 321 and ground bus 322, in other embodiments fewer vias and interconnects may be used. Furthermore, even though supply voltage bus 321 and ground bus 322 are illustratively depicted, in other embodiments such buses may not be available. However, routing through one or more RDLs 385 of interposer 220 may be used for interconnecting to supply voltage plane 316 and ground plane 315 to micro bumps 226 for providing capacitance to an IC die, as previously described.

As previously described, high-frequency voltage ripple on a power supply line or voltage supply line of an IC die may be reduced by filtering with capacitors 300. Such high-frequency voltage ripple may appear in power supply voltage on supply voltage bus 321 and/or supply voltage plane 316. Additional bypass capacitance provided by capacitors 300 of interposer 220 may be used to filter high-frequency noise voltage, where such noise voltage may be caused for example by parasitic inductance of package substrate 210 and/or PCB 390, along with changes in die current (di/dt) in an IC die, such as primary die 230 and/or secondary die 240. By high-frequency it is generally meant data rates in excess of 25 Gigabits per second ("Gbps").

Interposer 220 may be formed with other types of passive components other than capacitors 300. For example, in addition to capacitors, inductors may be integrated into interposer 220 such as to provide LC type voltage controlled oscillators and/or frequency specific LC filters which are designed to remove VCC noise. In addition, the interposer 220 may also include other passive components such as resistors.

Figure 6:
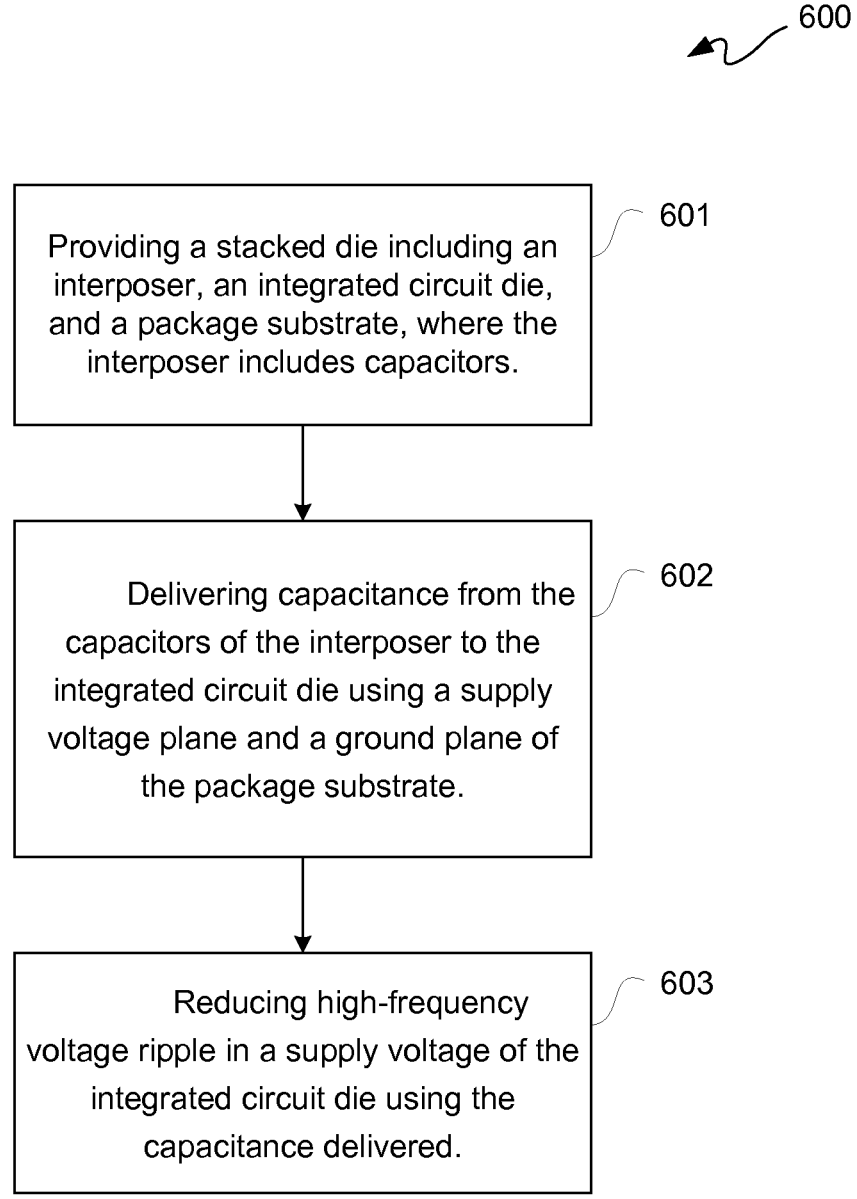
FIG. 6 is a flow diagram depicting an exemplary embodiment of a noise reduction process in the stacked die of FIG. 3.

FIG. 6 is a flow diagram depicting an exemplary embodiment of a noise reduction process 600 in stacked die 200 of FIG. 3. With simultaneous reference to FIGS. 3 and 6, noise reduction process 600 is further described. At 601, a stacked die 200 is provided. Such stacked die 200 includes an interposer 220 coupled to an integrated circuit die, such as primary die 230 and/or secondary die 240, with micro bumps 226, which interposer 220 is coupled to package substrate 210 with C4 bumps 320. Interposer 220 has capacitors 300 coupled in parallel between supply voltage plane 316 and ground plane 315.

At 602, capacitance from capacitors 300 of interposer 220 is delivered to an IC die, such as primary die 230 and/or secondary die 240, using supply voltage plane 316 and ground plane 315 of package substrate 210. At 603, high-frequency voltage ripple in a supply voltage of such IC die is reduced using such capacitance delivered at 602. Capacitors 300 are located sufficiently proximate to such IC die to reduce high-frequency voltage ripple.

While the foregoing describes exemplary embodiments, other and further embodiments in accordance with the one or more aspects may be devised without departing from the scope thereof, which is determined by the claims that follow and equivalents thereof. Claims listing steps do not imply any order of the steps. Trademarks are the property of their respective owners.

What is claimed is:

1. An apparatus, comprising:
a first integrated circuit die and a second integrated circuit die;
an interposer coupled to the first integrated circuit die and the second integrated circuit die using a first plurality of interconnects, the interposer including an upper surface having at least one open space between the first integrated circuit die and the second integrated circuit die, the interposer including a lower surface having a second plurality of interconnects, the interposer including a first cross-sectional region beneath the first integrated circuit die and the second integrated circuit die and a second cross-sectional region beneath the at least one open space, the first and second cross-sectional regions being disjoint, the second cross-sectional region being devoid of any through substrate vias extending between the upper surface and the lower surface;
a substrate coupled to the interposer using the second plurality of interconnects;
wherein the substrate includes a supply voltage plane and a ground plane each of which is coupled to the first integrated circuit die using the second plurality of interconnects, the interposer, and the first plurality of interconnects;
wherein the interposer includes a plurality of capacitors entirely disposed in the second cross-sectional region, the plurality of capacitors coupled in parallel using the supply voltage plane, the ground plane, and the second plurality of interconnects; and
wherein the plurality of capacitors of the interposer provide capacitance to the first integrated circuit die using the supply voltage plane and the ground plane of the substrate.

2. The apparatus according to claim 1, wherein:
the interposer includes a supply voltage bus and a ground bus; and
the plurality of capacitors are coupled in parallel using the supply voltage bus and the ground bus.

3. The apparatus according to claim 2, wherein:
the supply voltage bus is coupled to the supply voltage plane using the second plurality of interconnects; and
the ground bus is coupled to the ground plane using the second plurality of interconnects.

4. The apparatus according to claim 3, wherein:
the supply voltage plane is coupled in parallel with the supply voltage bus; and
the ground plane is coupled in parallel with the ground bus.

5. The apparatus according to claim 3, wherein the capacitance from the plurality of capacitors of the interposer is provided to the first integrated circuit die using the supply voltage bus and the ground bus of the interposer.

6. The apparatus according to claim 5, wherein the plurality of capacitors are located sufficiently proximate to the first integrated circuit die to reduce a high-frequency voltage ripple in a supply voltage on the supply voltage bus and the supply voltage plane.

7. The apparatus according to claim 5, wherein:
the second plurality of interconnects are connected to the through-substrate vias for coupling to the supply voltage bus and the ground bus through the through-substrate vias.

8. The apparatus according to claim 7, further comprising:
a third plurality of interconnects for coupling the substrate to a printed circuit board;
wherein the supply voltage plane and the ground plane are coupled to the third plurality of interconnects.

9. The apparatus according to claim 8, wherein:
the through-substrate vias are through-silicon vias;
the first plurality of interconnects are fine pitch micro bumps;
the second plurality of interconnects are C4 bumps; and
the third plurality of interconnects are ball grid array solder balls.

10. The apparatus according to claim 9, wherein the plurality of capacitors are selected from a group consisting of trench capacitors, parallel plate capacitors, container cell capacitors, finger capacitors, and metal-insulator-metal ("MIM") capacitors.

11. The apparatus according to claim 10,
wherein the first integrated circuit die has a first layout area; and
wherein the second integrated circuit die has a second layout area smaller than the first layout area.

12. The apparatus according to claim 5, wherein the first integrated circuit die has at least one logic block associated with positioning of the plurality of capacitors.

13. The apparatus according to claim 5, wherein:
the plurality of capacitors are formed in banks of parallel capacitors; and
each of the banks of parallel capacitors is in parallel with one another.

14. An apparatus, comprising:
a first integrated circuit die including a first capacitor for providing a first capacitance;
a second integrated circuit die;
an interposer coupled to the first integrated circuit die and the second integrated circuit die using a first plurality of interconnects, the interposer including an upper surface having at least one open space between the first integrated circuit die and the second integrated circuit die, the interposer including a lower surface having a second plurality of interconnects, the interposer including a first cross-sectional region beneath the first integrated circuit die and the second integrated circuit die and a second cross-sectional region beneath the at least one open space, the first and second cross-sectional regions being disjoint, the second cross-sectional region being devoid of any through substrate vias extending between the upper surface and the lower surface;
a substrate coupled to the interposer using the second plurality of interconnects;
wherein the substrate includes a supply voltage plane and a ground plane coupled to the integrated circuit die using the second plurality of interconnects, the interposer, and the first plurality of interconnects;
wherein the interposer includes a plurality of capacitors entirely disposed in the second cross-sectional region, the plurality of capacitors coupled in parallel using the supply voltage plane, the ground plane, and the second plurality of interconnects;
wherein the substrate includes a second capacitor coupled to the supply voltage plane and the ground plane for providing a second capacitance to the integrated circuit die through the interposer; and
wherein a third capacitance from the plurality of capacitors of the interposer is provided to the integrated circuit die using the supply voltage plane and the ground plane of the substrate.

15. The apparatus according to claim 14, wherein:
the first capacitor is coupled to the supply voltage plane and the ground plane using the first plurality of interconnects; and
the first capacitance, the second capacitance and the third capacitance in combination are used to reduce a high-frequency voltage ripple in a power supply voltage of the integrated circuit die.

16. The apparatus according to claim 14, wherein the first capacitor, the second capacitor, and the plurality of capacitors are all coupled in parallel with one another.

* * * * *